(12) United States Patent
Yamada et al.

(10) Patent No.: US 6,441,427 B1
(45) Date of Patent: Aug. 27, 2002

(54) NOR-TYPE FLASH MEMORY AND METHOD FOR MANUFACTURING THE SAME

(75) Inventors: Seiji Yamada, Tokyo; Michiharu Matsui, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/364,038

(22) Filed: Jul. 30, 1999

(30) Foreign Application Priority Data

Jul. 31, 1998 (JP) .......................................... 10-217752

(51) Int. Cl.⁷ ........................ H01L 29/788; H01L 29/00
(52) U.S. Cl. ........................................ 257/315; 257/513
(58) Field of Search ................................ 257/315, 513; 438/296, 424

(56) References Cited

U.S. PATENT DOCUMENTS 5,282,160 A  *  1/1994  Yamagata ................... 365/185
5,408,429 A  *  4/1995  Sawada ...................... 365/185
5,498,891 A  *  3/1996  Sato .......................... 257/316
5,559,048 A  *  9/1996  Inoue ......................... 438/257
5,994,733 A  * 11/1999  Nishioka et al. ............ 257/316

FOREIGN PATENT DOCUMENTS

| JP | 4-75390 | | 7/1990 |
| JP | 05198778 A | * | 8/1993 |
| JP | 7-147389 | | 11/1993 |

* cited by examiner

*Primary Examiner*—Howard Weiss
(74) *Attorney, Agent, or Firm*—Banner & Witcoff, Ltd.

(57) ABSTRACT

Trenches are formed by using stripe-form patterns with the same width and the same interval as a mask in the surface area of a silicon substrate and element isolation regions of STI structure are formed by filling insulating films into the trenches. Further, slits for isolating floating gates are formed by etching a polysilicon layer by using stripe-form patterns with the same width and the same interval as a mask. In addition, control gates (word lines) are formed by subjecting the polysilicon layer to the anisotropic etching process by using stripe-form patterns with the same width and the same interval as a mask.

7 Claims, 7 Drawing Sheets

NOR-TYPE FLASH MEMORY AND METHOD FOR MANUFACTURING THE SAME

BACKGROUND OF THE INVENTION

This invention relates to a nonvolatile semiconductor memory device such as a NOR-type flash memory and a method for manufacturing the same, and more particularly to the pattern construction of a memory cell array.

FIGS. 1A to 1D show the pattern construction of a memory cell array in a NOR-type flash memory as an example of the conventional nonvolatile semiconductor memory device. FIG. 1A is a pattern plan view, FIG. 1B is a cross sectional view taken along the 1B—1B line of the pattern of FIG. 1A, FIG. 1C is a cross sectional view taken along the 1C—1C line of the pattern of FIG. 1A, and FIG. 1D is a cross sectional view taken along the 1D—1D line of the pattern of FIG. 1A.

As shown in FIGS. 1A to 1D, field oxide films (element isolation regions) 2 are formed on the main surface of a silicon substrate 1 by the LOCOS method. Source and drain regions 3 and 4 are separately formed on the surface areas of the silicon substrate 1 which are separated by the field oxide film 2. Each source region 3 is formed of a pattern which is continuous in the row direction and commonly used by adjacent memory cells (cell transistors). A floating gate 6 is formed above the channel region between the source and drain regions 3 and 4 of each cell transistor with a tunnel oxide film 5 disposed therebetween. A control gate 8 is formed above the floating gate 6 with an insulating film 7 disposed therebetween. Each control gate 8 is formed to extend along the row direction to construct a word line. An inter-level insulating film 9 is formed on the stacked gate structure and bit lines 10 and common source lines 11 are formed on the inter-level insulating film 9 in a column direction which intersects the word lines (control gates) 8. The common source line 11 is connected to the source regions 3 via through holes 13 in source contact portions 12 and the bit line 10 is connected to the drain regions 4 via through holes 14.

In the NOR-type flash memory with the above structure, it is necessary to make contacts between the common source line 11 and the source regions 3 of the cell transistors in the pattern of the memory cell array. In this case, if formation of the through holes 13 in the inter-level insulating film and mask misalignment are taken into consideration, the patterns of the source regions 3 and common source line 11 in the source contact portions 12 must be made large or wide and the field oxide films (element isolation regions) 2 become different in the shape and interval thereof from the other region in the memory cell array. Therefore, the pattern formed when a slit for forming the floating gate 6 is formed becomes different in the interval thereof in the source contact portion 12 and in the memory cell section, and the pattern configuration of the word line 8 becomes different in some cases. As a result, repetitiveness with the regular interval of the pattern of the whole memory cell array is disturbed, and the etching process for forming the slits in this portion or the etching process for forming the word lines cannot be uniformly effected, thereby causing variations in various electrical characteristics for each memory cell thus formed, for example, the erasing characteristic by the F-N (Fowler-Nordheim) current and the programming characteristic by channel hot electrons. If the erasing characteristic is varied, the threshold voltage of the memory cell after erasing becomes negative, thereby causing a cell current to always flow irrespective of the word line potential. Therefore, if one of memory cells lying on the same bit line as the defective cell is selected, an erroneous reading operation may be effected.

As described above, the conventional nonvolatile semiconductor memory device and a method for manufacturing the same have a problem that the etching process becomes non-uniform and various electrical characteristics for each memory cell are varied since a portion in which repetitiveness with the regular interval of the pattern of the memory cell array is disturbed is present.

BRIEF SUMMARY OF THE INVENTION

Accordingly, a first object of this invention is to provide a nonvolatile semiconductor memory device capable of preventing a variation in the etching process due to the disturbance of repetitiveness with the regular interval of the pattern of the memory cell array and making the various electrical characteristics of each memory cell uniform.

A second object of this invention is to provide a method for manufacturing a nonvolatile semiconductor memory device capable of preventing a variation in the etching process due to the disturbance of repetitiveness with the regular interval of the pattern of the memory cell array and making the various electrical characteristics of each memory cell uniform.

The first object of this invention can be attained by a nonvolatile semiconductor memory device having a memory cell array in which nonvolatile memory cells are arranged in an array form on a semiconductor substrate and which has element regions isolated by element isolation regions of STI (Shallow Trench Isolation) structure, wherein the element isolation regions include a plurality of stripe-form trenches regularly arranged with substantially the same width and the same interval in an area from one end to the opposite end of the memory cell array and insulating films filled in the trenches.

With the above construction, since the plurality of trenches which form the element isolation regions of STI structure are formed in a narrow stripe-form configuration with substantially the same width and the same interval and the pattern has the high degree of repetitiveness with the regular interval, occurrence of a variation in the etching process can be prevented and the various electrical characteristics of each memory cell can be made uniform.

The first object of this invention can be attained by a nonvolatile semiconductor memory device having a memory cell array in which nonvolatile memory cells are arranged in an array form on a semiconductor substrate, wherein each of the memory cells includes a tunnel insulating film formed on the semiconductor substrate between source and drain regions, a floating gate formed on the tunnel insulating film by isolating a silicon layer by use of plurality of stripe-form slits regularly formed with substantially the same width and the same interval in an area from one end to the opposite end of the memory cell array, an insulating film formed on the floating gate, and a control gate formed on the insulating film.

With the above construction, since the plurality of slits which form the floating gate by isolating the silicon layer are formed in a narrow stripe-form configuration with substantially the same width and the same interval and the pattern of the memory cell array has the high degree of repetitiveness with the regular interval, occurrence of a variation in the etching process can be prevented and the various electrical characteristics of each memory cell can be made uniform.

The first object of this invention can be attained by a nonvolatile semiconductor memory device having a memory cell array in which nonvolatile memory cells are arranged in an array form on a semiconductor substrate, wherein a plurality of stripe-form word lines regularly arranged with substantially the same width and the same interval in an area from one end to the opposite end of the memory cell array are provided.

With the above construction, since the plurality of word lines (control gates) are formed in a narrow stripe-form configuration with substantially the same width and the same interval and the pattern of the memory cell array has the high degree of repetitiveness with the regular interval, occurrence of a variation in the etching process can be prevented and the various electrical characteristics of each memory cell can be made uniform.

The first object of this invention can be attained by a nonvolatile semiconductor memory device having a memory cell array in which nonvolatile memory cells are arranged in an array form on a semiconductor substrate and which has element regions isolated by element isolation regions of STI (Shallow Trench Isolation) structure, wherein the element isolation regions include a plurality of stripe-form trenches regularly arranged with substantially the same width and the same interval along a first direction from one end to the opposite end of the memory cell array and insulating films filled in the trenches, and each of the memory cells includes a tunnel insulating film formed on the semiconductor substrate between source and drain regions, a floating gate formed on the tunnel insulating film by isolating a silicon layer by use of a plurality of stripe-form slits regularly formed with substantially the same width and the same interval along the first direction from one end to the opposite end of the memory cell array, an insulating film formed on the floating gate, and a control gate formed on the insulating film.

With the above construction, since the plurality of trenches which form the element isolation regions of STI structure are formed in a narrow strip-form configuration with substantially the same width and the same interval, the plurality of slits for forming the floating gate by isolating the silicon layer are formed in a narrow strip-form configuration with substantially the same width and the same interval and the pattern of the memory cell array has the higher degree of repetitiveness with the regular interval, occurrence of a variation in the etching process can be prevented and the various electrical characteristics of each memory cell can be made uniform.

Further, the first object of this invention can be attained by a nonvolatile semiconductor memory device having a memory cell array in which nonvolatile memory cells are arranged in an array form on a semiconductor substrate and which has element regions isolated by element isolation regions of STI (Shallow Trench Isolation) structure, wherein the element isolation regions include a plurality of stripe-form trenches regularly arranged with substantially the same width and the same interval along a first direction from one end to the opposite end of the memory cell array and insulating films filled in the trenches, each of the memory cells includes a tunnel insulating film formed on the semi-conductor substrate between source and drain regions, a floating gate formed on the tunnel insulating film, an insulating film formed on the floating gate, and a control gate formed on the insulating film, and the control gate forms a plurality of stripe-form word lines regularly arranged with substantially the same width and the same interval along a second direction which intersects the first direction from one end to the opposite end of the memory cell array.

With the above construction, since the plurality of trenches which form the element isolation regions of STI structure are formed in a narrow stripe-form configuration with substantially the same width and the same interval and the plurality of word lines (control gates) are formed in a narrow stripe-form configuration with substantially the same width and the same interval, the pattern of the memory cell array has the higher degree of repetitiveness with the regular interval, occurrence of a variation in the etching process can be prevented and the various electrical characteristics of each memory cell can be made uniform.

The first object of this invention can be attained by a nonvolatile semiconductor memory device having a memory cell array in which nonvolatile memory cells are arranged in an array form on a semiconductor substrate, wherein each of the memory cells includes a tunnel insulating film formed on the semiconductor substrate between source and drain regions, a floating gate formed on the tunnel insulating film by isolating a silicon layer by use of a plurality of stripe-form slits regularly formed with substantially the same width and the same interval along a first direction from one end to the opposite end of the memory cell array, an insulating film formed on the floating gate, and a control gate formed on the insulating film, and the control gates constitute a plurality of stripe-form word lines regularly arranged with substantially the same width and the same interval in a second direction which intersects the first direction from one end to the opposite end of the memory cell array.

With the above construction, since the plurality of stripe-form slits for forming the floating gates by isolating the silicon layer are regularly formed in a narrow stripe-form configuration with substantially the same width and the same interval and the plurality of word lines (control gates) are also formed in a narrow stripe-form configuration with substantially the same width and the same interval, the pattern of the memory cell array has the higher degree of repetitiveness with the regular interval, occurrence of a variation in the etching process can be prevented and the various electrical characteristics of each memory cell can be made uniform.

The first object of this invention can be attained by a nonvolatile semiconductor memory device having a memory cell array in which nonvolatile memory cells are arranged in an array form on a semiconductor substrate and which has element regions isolated by element isolation regions of STI (Shallow Trench Isolation) structure, wherein the element isolation regions include a plurality of stripe-form trenches regularly arranged with substantially the same width and the same interval in a first direction from one end to the opposite end of the memory cell array and insulating films filled in the trenches, each of the memory cells includes a tunnel insulating film formed on the semiconductor substrate between source and drain regions, a floating gate formed on the tunnel insulating film by isolating a silicon layer by use of a plurality of stripe-form slits regularly formed with substantially the same width and the same interval along the first direction from one end to the opposite end of the memory cell array, an insulating film formed on the floating gate, and a control gate formed on the insulating film, and the control gates constitute a plurality of stripe-form word lines regularly arranged with substantially the same width and the same interval in a second direction which intersects the first direction from one end to the opposite end of the memory cell array.

With the above construction, since the plurality of trenches which form the element isolation regions of STI structure are formed in a narrow stripe-form configuration with substantially the same width and the same interval, the slits for forming the floating gates by isolating the silicon layer are formed in a continuous narrow stripe-form configuration with substantially the same width and the same interval and the plurality of word lines (control gates) are also formed in a narrow stripe-form configuration with substantially the same width and the same interval, the pattern of the memory cell array has the higher degree of repetitiveness with the regular interval, a variation in the etching process can be prevented and the various electrical characteristics of each memory cell can be made uniform.

The second object of this invention can be attained by a method for manufacturing a nonvolatile semiconductor memory device comprising the steps of forming a plurality of stripe-form trenches arranged with substantially the same width and the same interval in a first direction on the main surface of a semiconductor substrate; forming element isolation regions of STI (Shallow Trench Isolation) structure by filling insulating films in the trenches; forming a tunnel insulating film on element regions of the semiconductor substrate isolated by the element isolation regions; forming a first polysilicon layer on the tunnel insulating film; forming a plurality of stripe-form slits arranged with substantially the same width and the same interval in the first polysilicon layer in the first direction; forming an insulating film on the first polysilicon layer in which the slits are formed; forming a second polysilicon layer on the insulating film; and patterning a stacked structure of the second polysilicon layer, insulating film and first polysilicon layer to form stripe-form patterns with substantially the same width and the same interval in a second direction which intersects the first direction.

With the above manufacturing method, since the plurality of trenches which form the element isolation regions of STI structure are formed in a narrow stripe-form configuration with substantially the same width and the same interval, the plurality of slits used for forming openings in the first polysilicon layer are formed in a narrow stripe-form configuration with substantially the same width and the same interval and the stacked structure of the second polysilicon layer, insulating film and first polysilicon layer is patterned into a plurality of line patterns with substantially the same width and the same interval, the pattern of the memory cell array has the extremely high degree of repetitiveness with the regular interval, occurrence of a variation in each etching process can be prevented and the various electrical characteristics of each memory cell can be made uniform.

Further, the second object of this invention can be attained by a method for manufacturing a nonvolatile semiconductor memory device comprising the steps of forming a tunnel insulating film on element regions of a semiconductor substrate which are isolated by element isolation regions; forming a first polysilicon layer on the tunnel insulating film; forming a plurality of stripe-form slits arranged with substantially the same width and the same interval in the first polysilicon layer in a first direction; forming an insulating film on the first polysilicon layer in which the slits are formed; forming a second polysilicon layer on the insulating film; and patterning a stacked structure of the second polysilicon layer, insulating film and first polysilicon layer to form stripe-form patterns with substantially the same width and the same interval in a second direction which intersects the first direction.

With the above manufacturing method, since the plurality of slits used for forming the openings in the first polysilicon layer are formed in a narrow stripe-form configuration with substantially the same width and the same interval and the stacked structure of the second polysilicon layer, insulating film and first polysilicon layer is patterned into a plurality of line patterns with substantially the same width and the same interval, the pattern of the memory cell array has the extremely high degree of repetitiveness with the regular interval, occurrence of a variation in each etching process can be prevented and the various electrical characteristics of each memory cell can be made uniform.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3B is a cross sectional view taken along the 3B—3B line of the pattern shown in FIG. 3A, for illustrating the method for manufacturing the nonvolatile semiconductor memory device according to the embodiment of this invention;

DETAILED DESCRIPTION OF THE INVENTION

Figure 1A:
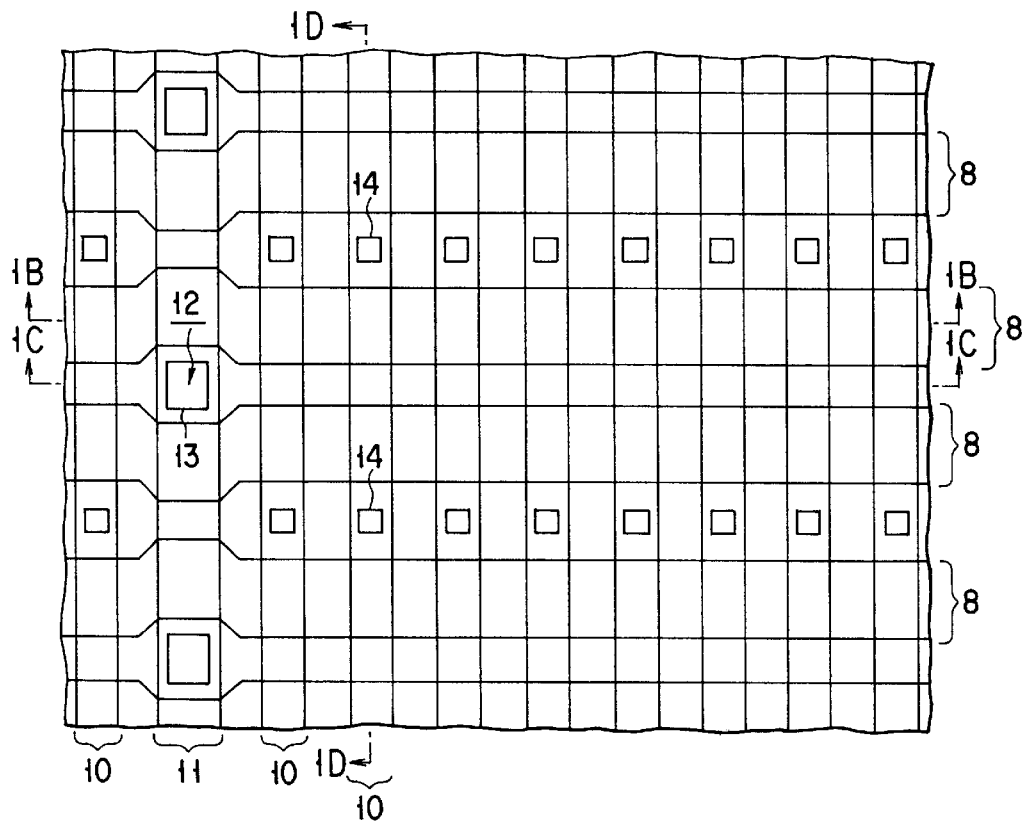
FIG. 1A is a pattern plan view showing a memory cell array in a NOR-type flash memory, for illustrating the conventional nonvolatile semiconductor memory device.
Figure 1B:
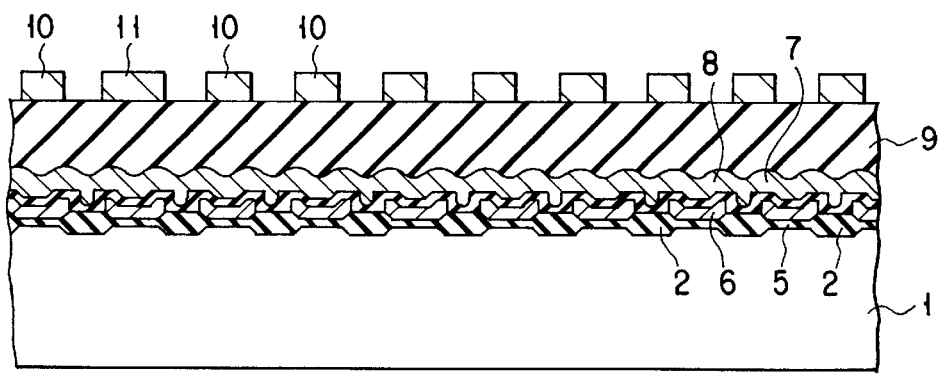
FIG. 1B is a cross sectional view taken along the 1B—1B line of the pattern shown in FIG. 1A, for illustrating the conventional nonvolatile semiconductor memory device.
Figure 1C:
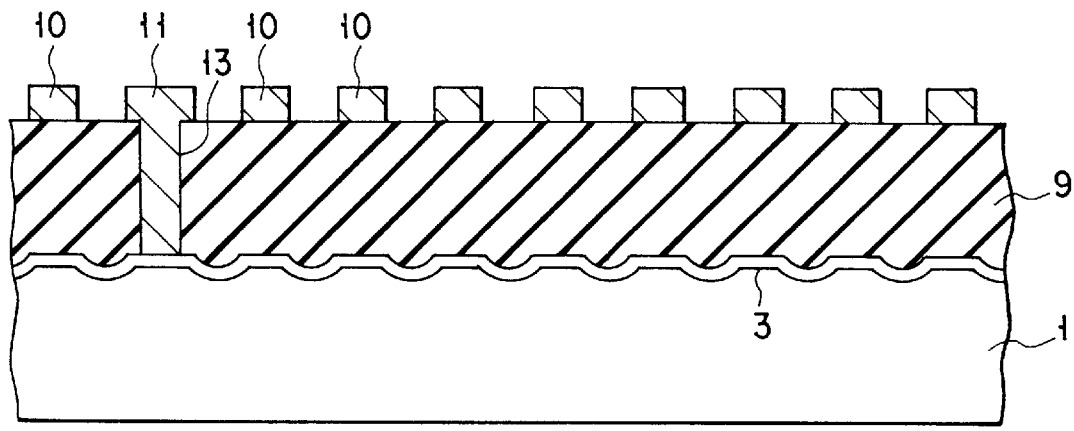
FIG. 1C is a cross sectional view taken along the 1C—1C line of the pattern shown in FIG. 1A, for illustrating the conventional nonvolatile semiconductor memory device.
Figure 1D:
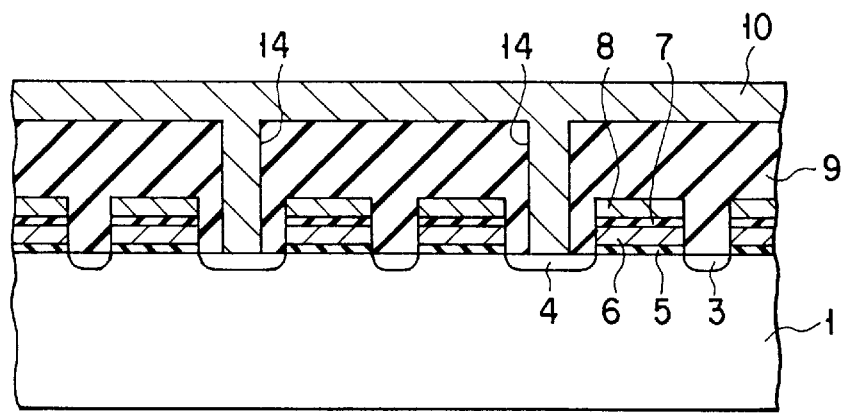
FIG. 1D is a cross sectional view taken along the 1D—1D line of the pattern shown in FIG. 1A, for illustrating the conventional nonvolatile semiconductor memory device.
Figure 2A:
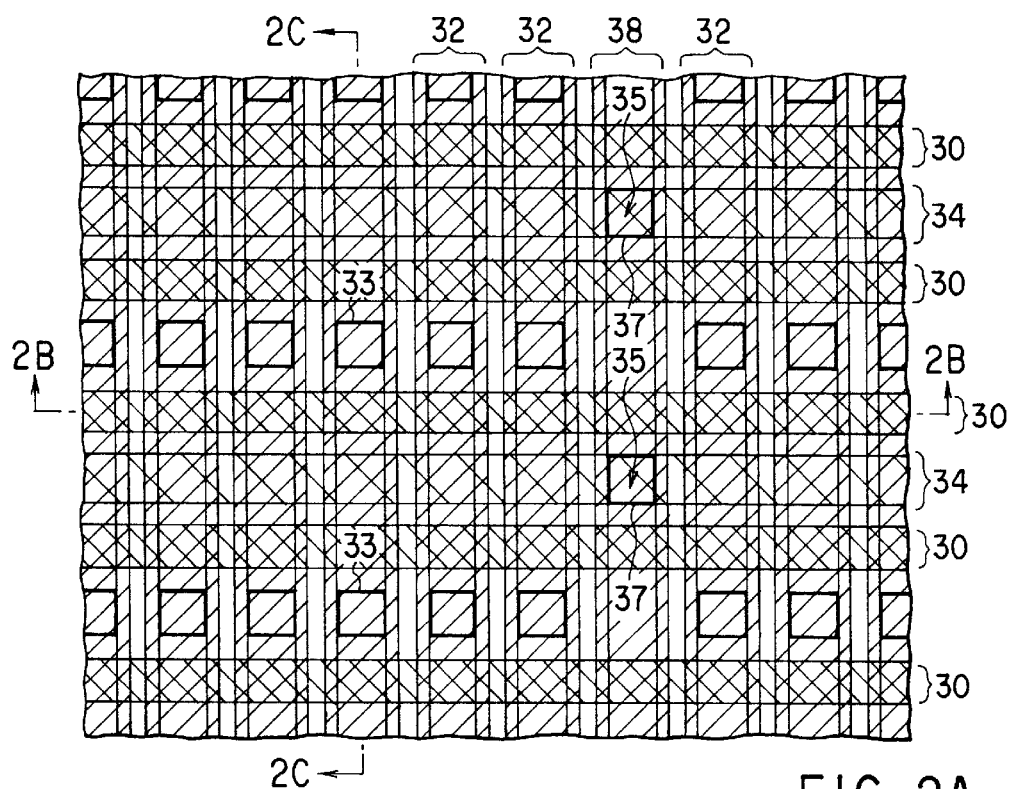
FIG. 2A is a pattern plan view showing a memory cell array in a NOR-type flash memory, for illustrating a nonvolatile semiconductor memory device according to an embodiment of this invention.
Figure 2B:
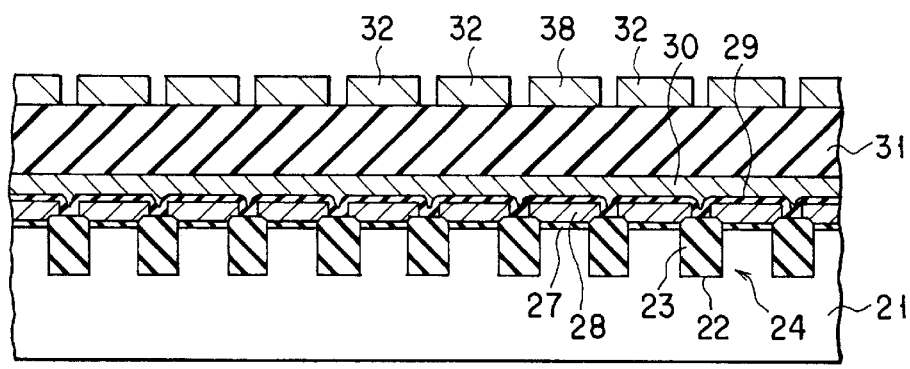
FIG. 2B is a cross sectional view taken along the 2B—2B line of the pattern shown in FIG. 2A, for illustrating the nonvolatile semiconductor memory device according to an embodiment of this invention.
Figure 2C:
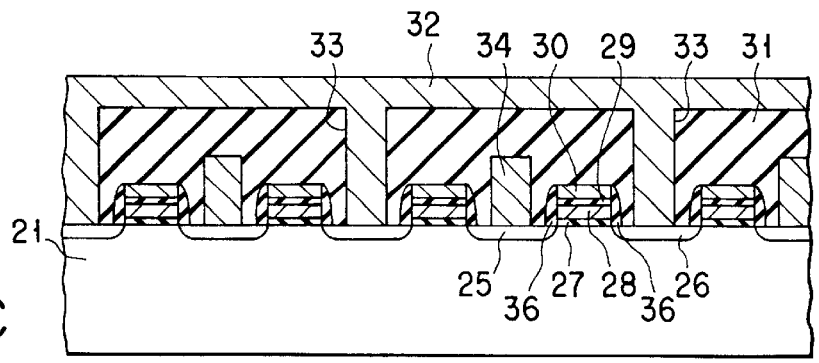
FIG. 2C is a cross sectional view taken along the 2C—2C line of the pattern shown in FIG. 2A, for illustrating the nonvolatile semiconductor memory device according to an embodiment of this invention.

FIGS. 2A to 2C illustrate a nonvolatile semiconductor memory device according to an embodiment of this invention and show the pattern construction of a memory cell array in a NOR-type flash memory. FIG. 2A is a pattern plan view showing a memory cell array, FIG. 2B is a cross sectional view taken along the 2B—2B line of the pattern shown in FIG. 2A, and FIG. 2C is a cross sectional view taken along the 2C—2C line of the pattern shown in FIG. 2A.

As shown in FIGS. 2A to 2C, a plurality of narrow stripe-form trenches 22 with the same width in the column direction of the memory cell array are formed at equal intervals from the left end to the right end of the memory cell array on the main surface of a silicon substrate (semiconductor substrate) 21. In the trenches 22, insulating films 23 are filled to form element isolation regions 24 of STI (Shallow Trench Isolation) structure. Source and drain regions 25 and 26 are separated with a preset distance and formed in element regions of the silicon substrate 21 isolated by the element isolation regions 24. Thin insulating films (tunnel insulating films) 27 are each formed on the silicon substrate 21 between the source and drain regions 25 and 26, and floating gates 28 formed of a polysilicon layer (silicon layer), for example, are formed on the respective tunnel insulating films 27. The floating gates 28 are separated by forming slits by use of a mask having a plurality of line patterns with the same width and the same interval from the left end to the right end of the memory cell array in a narrow stripe-form configuration in the column direction of the memory cell array when an anisotropic etching process for patterning the polysilicon layer is effected. A control gate 30 is formed of a polysilicon layer or the like above the floating gate 28 with an insulating film 29 disposed therebetween. The control gate 30 is formed into a plurality of line patterns with the same width and the same interval from the upper end to the lower end of the memory cell array in a narrow stripe-form configuration in the row direction of the memory cell array to construct word lines. An SiN film 36 is formed on the side wall section of a stacked (gate) structure formed of the floating gate 28, insulating film 29 and control gate 30. A source line 34 formed of a tungsten (W) layer or the like is formed in the row direction on each of the source regions 25. An inter-level insulating film 31 is formed on the stacked gate structure and a plurality of bit lines 32 are formed in a narrow stripe-form configuration on the inter-level insulating film 31 in the column direction of the memory cell array. Further, a metal wiring 38 is formed in a narrow stripe-form configuration in the column direction of the memory cell array in part of a space between the bit lines 32 on the inter-level insulating film 31 and the bit lines 32 and metal wiring 38 are arranged with the same width and the same interval from the left end to the right end of the memory cell array. The metal wiring 38 is used as a common source line for commonly connecting the source lines 34 and connected to the source lines 34 via through holes 37 in respective source contact portions 35. Each of the bit lines 32 is connected to the drain regions 26 of the cell transistors via through holes 33 formed in the inter-level insulating film 31.

With the above structure, since a plurality of trenches 22 (element isolation regions 24), floating gates 28 and word lines (control gates) 30 are formed with the same width and regularly arranged at the same intervals and the pattern of the memory cell array is formed with the high degree of repetitiveness with the regular interval, occurrence of a variation in the etching process can be prevented and the various electrical characteristics of each memory cell can be made uniform. As a result, for example, since the distribution range of the threshold voltage after the erasing process can be suppressed within a narrow range, occurrence of an erroneous readout problem caused when the threshold voltage of the memory cell becomes negative can be prevented.

As the position where the repetitiveness with the regular interval of the pattern is disturbed, the end portion of the memory cell array remains, but if several rows or columns of dummy patterns which have the same interval and are not used as the memory cells are arranged in the end portion, the extremely uniform etching process for the memory cell section actually used can be attained. Further, even when a portion in which the repetitiveness with the regular interval of the pattern is disturbed is present in the memory cell array, no problem occurs if the memory cells of several bits around the portion are not used.

FIGS. 3A and 3B to FIGS. 6A and 6B show the pattern constructions of the memory cell array in the NOR-type flash memory shown in FIGS. 2A to 2C in the manufacturing order, for illustrating the manufacturing method of the nonvolatile semiconductor memory device according to an embodiment of this invention. FIGS. 3A, 4A, 5A and 6A are pattern plan views and FIGS. 3B, 4B, 5B and 6B are cross sectional views taken along the 3B—3B line, 4B—4B line, 5B—5B line and 6B—6B line of the patterns shown in FIGS. 3A, 4A, 5A and 6A, respectively.

Figure 3A:
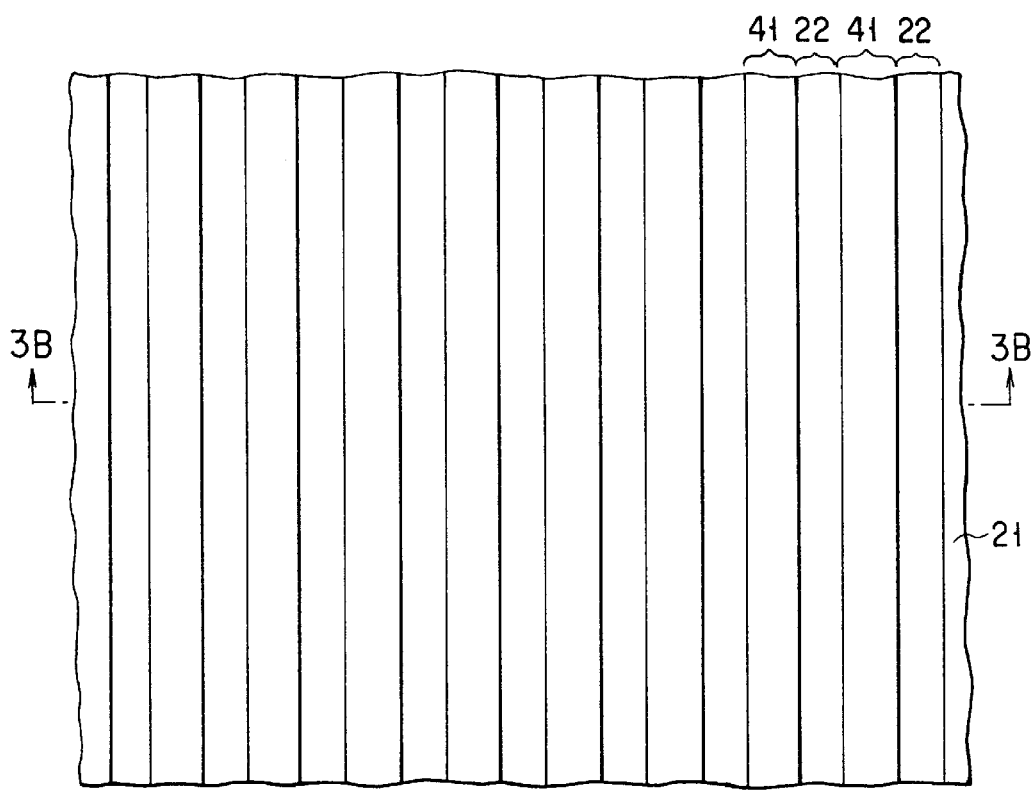
FIG. 3B is a cross sectional view taken along the 3B—3B line of the pattern shown in FIG. 3A, for illustrating a method for manufacturing the nonvolatile semiconductor memory device according to an embodiment of this invention.
Figure 3B:
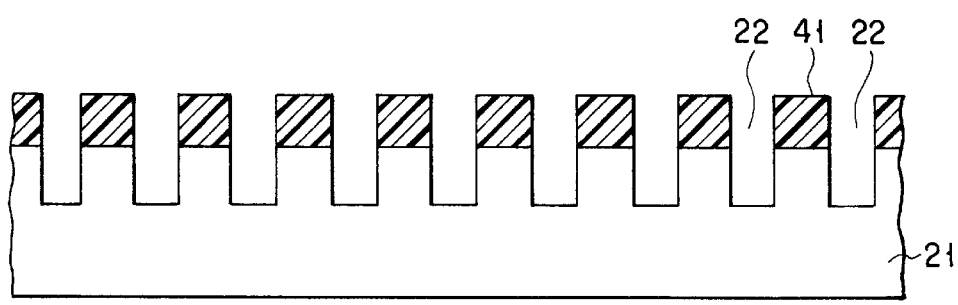
Figure 4A:
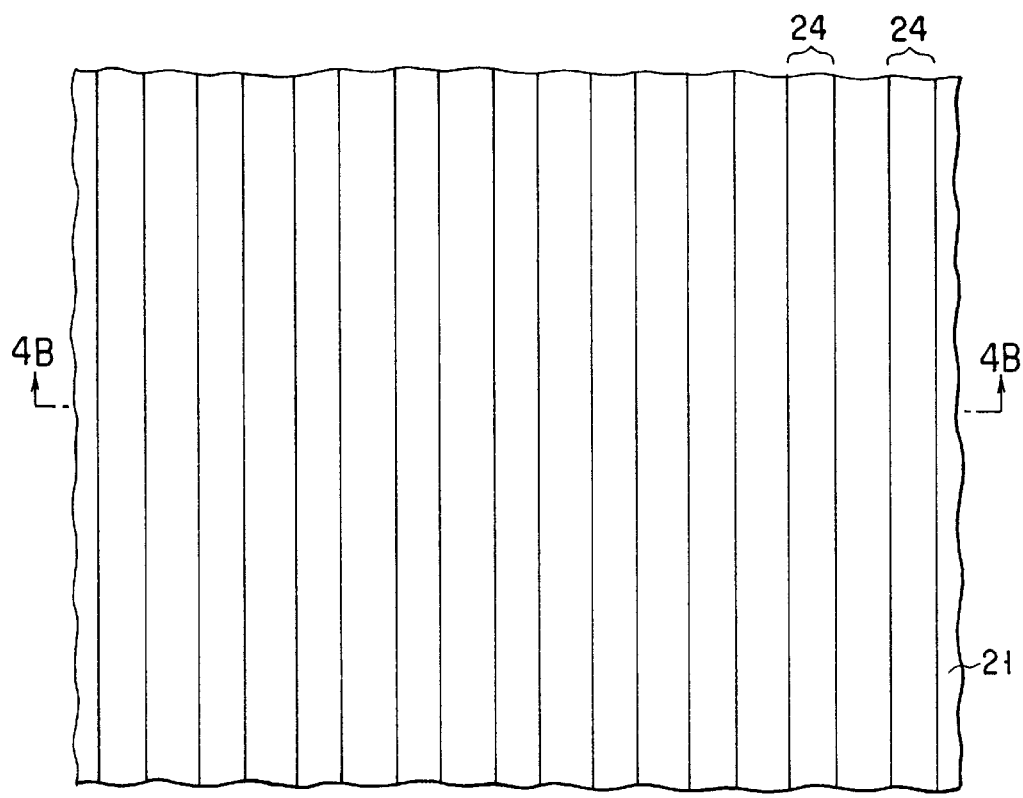
FIG. 4A is a pattern plan view showing a second step of a manufacturing process for manufacturing the memory cell array in the NOR-type flash memory, for illustrating a method for manufacturing the nonvolatile semiconductor memory device according to an embodiment of this invention.
Figure 4B:
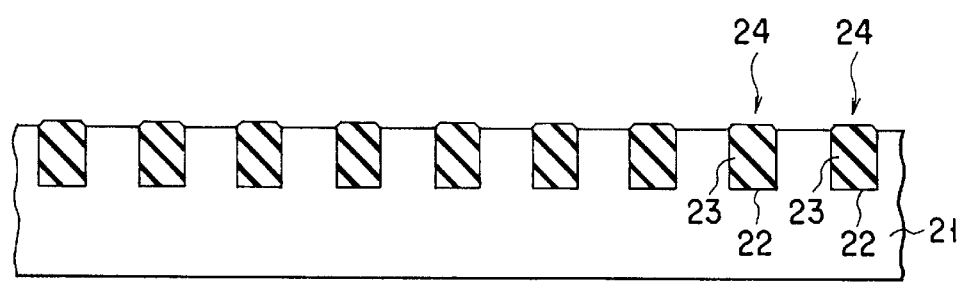
FIG. 4B is a cross sectional view taken along the 4B—4B line of the pattern shown in FIG. 4A, for illustrating a method for manufacturing the nonvolatile semiconductor memory device according to an embodiment of this invention.

First, as shown in FIGS. 3A and 3B, resist patterns 41 are formed in a narrow stripe-form in the column direction of the memory cell array on the silicon substrate 21 with the same width and the same interval from the left end to the right end and the main surface of the silicon substrate 21 is subjected to the anisotropic etching process to form trenches 22. Thus, by using the resist patterns 41, any part of the trenches 22 can be uniformly etched.

Next, for example, after a silicon oxide film is formed by deposition on the entire surface of the silicon substrate 21 by the CVD method, an etch-back process is effected to remove the silicon oxide film on the main surface of the silicon substrate 21 and thus the silicon oxide film is left behind in the trenches 22 to form insulating films 23. As a result, the element isolation regions 24 of STI structure are formed (refer to FIGS. 4A and 4B).

Figure 5A:
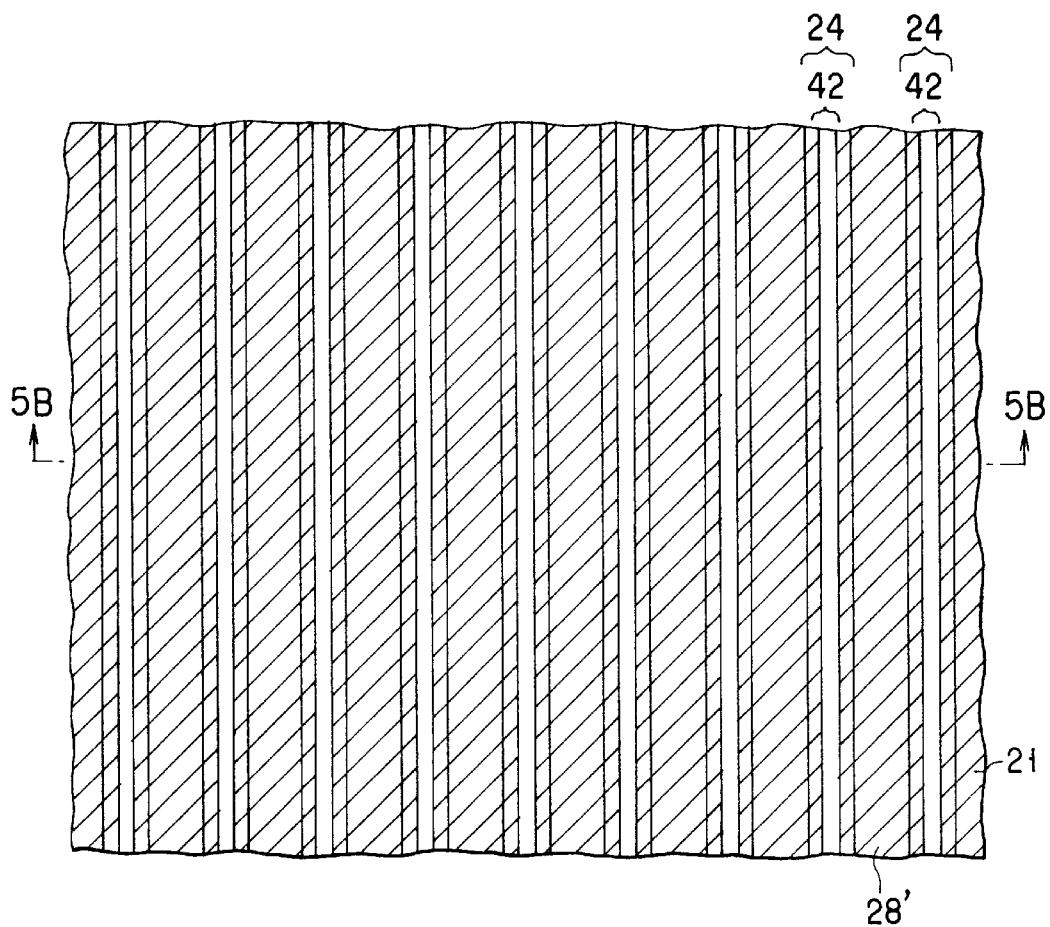
FIG. 5A is a pattern plan view showing a third step of a manufacturing process for manufacturing the memory cell array in the NOR-type flash memory, for illustrating a method for manufacturing the nonvolatile semiconductor memory device according to an embodiment of this invention.
Figure 5B:
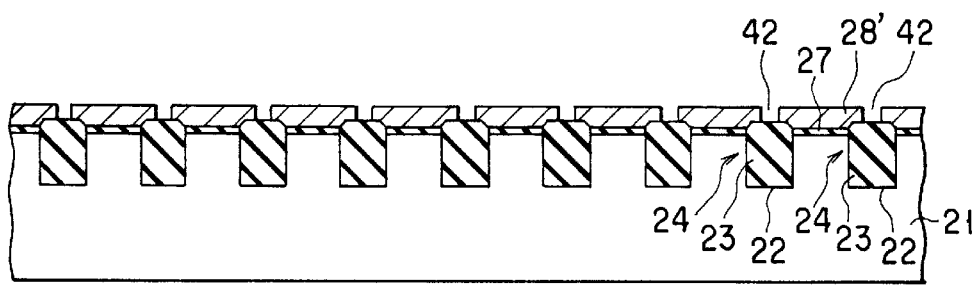
FIG. 5B is a cross sectional view taken along the 5B—5B line of the pattern shown in FIG. 5A, for illustrating a method for manufacturing the nonvolatile semiconductor memory device according to an embodiment of this invention.

After this, as shown in FIGS. 5A and 5B, the surfaces of the element regions of the substrate 21 which are isolated or separated by the element isolation regions 24 of STI structure are subjected to a thermal oxidation process to form thin insulating films 27 on the surface thereof and then a polysilicon layer 28' is formed by deposition on the entire surface of the semiconductor structure. The polysilicon layer 28' is subjected to the anisotropic etching process by use of resist patterns of narrow stripe-form in the column direction of the memory cell array with the same width and the same interval from the left end to the right end to form slits 42. Also, at the time of etching for forming the slits 42, the uniform etching process can be effected.

Figure 6A:
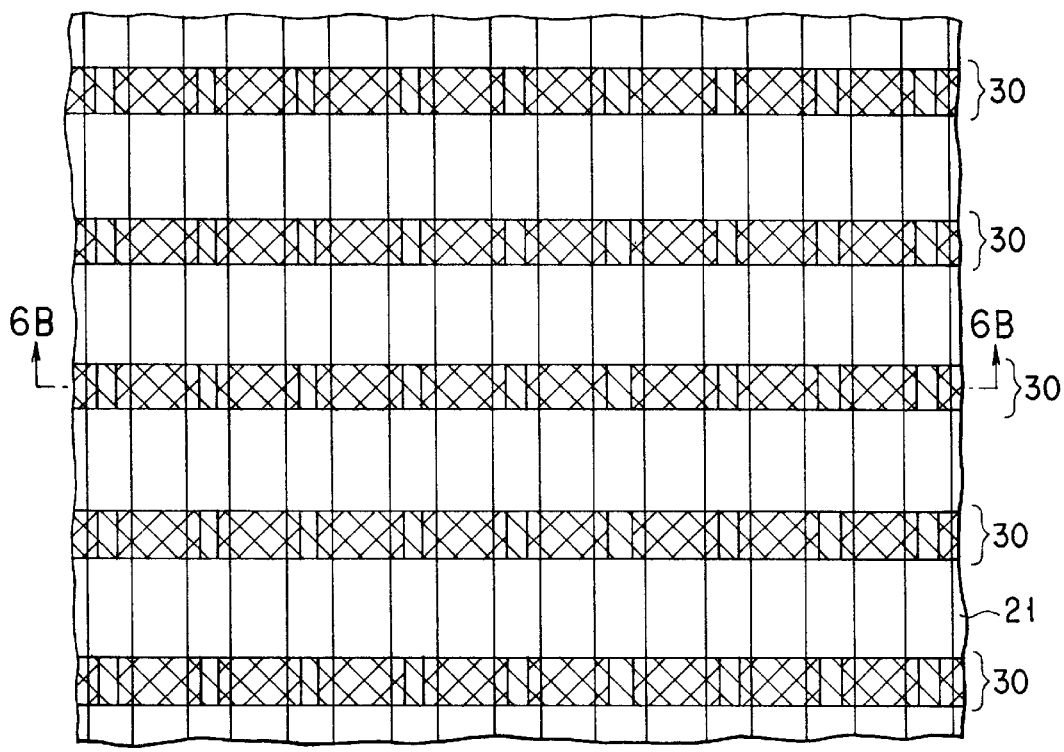
FIG. 6A is a pattern plan view showing a fourth step of a manufacturing process for manufacturing the memory cell array in the NOR-type flash memory, for illustrating a method for manufacturing the nonvolatile semiconductor memory device according to an embodiment of this invention.
Figure 6B:
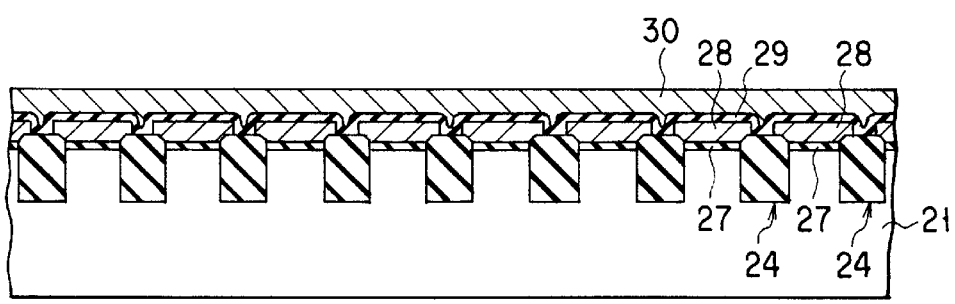
FIG. 6B is a cross sectional view taken along the 6B—6B line of the pattern shown in FIG. 6A, for illustrating a method for manufacturing the nonvolatile semiconductor memory device according to an embodiment of this invention.

After etching the polysilicon layer 28', an insulating film 29 is formed on the polysilicon layer 28' as shown in FIGS. 6A and 6B, and a polysilicon layer is formed on the insulating film 29. Then, resist patterns for forming word lines are formed on the polysilicon layer. The resist patterns are formed of a narrow stripe-form in the row direction of the memory cell array with the same width and the same interval from the upper end to the lower end. With the resist patterns used as a mask, a stacked structure of the polysilicon layer, insulating film 29 and polysilicon layer 28' is patterned by the anisotropic etching process. Thus, the polysilicon layer is uniformly etched to form control gates (word lines) 30 and divide the polysilicon layer 28' into individual floating gates.

After this, with the stacked gate structures of the control gates 30, insulating films 29 and floating gates 28 used as a mask, impurities are ion-implanted into the element regions of the substrate 21 and activated by the heat treatment to form source and drain regions 25 and 26. Then, after an SiN film 36 is formed on the entire surface of the semiconductor structure, an etch-back process is effected to leave the SiN film on the side wall portions of the stacked gate structures. Further, tungsten layers are formed on the source regions 25 by the LPCVD method or the like to form source lines 34.

Next, an inter-level insulating film 31 is formed on the entire surface by the CVD method, for example. Then, through holes 33 are formed in portions of the inter-level insulating film 31 which correspond to the drain regions 26 and through holes 37 are formed in respective contact portions 35. At this time, even when slight mask misalignment occurs, the SiN films 35 left on the side wall portions of the stacked gate structures act as stoppers of etching so that the through holes 33 and 37 can be prevented from reaching the control gates 30 and floating gates 28 to cause short circuits between the bit lines 32 and metal wirings 38. However, in this case, as shown in FIG. 6A, since the pattern construction of the memory cell array is made such that the space between the word lines is made larger than the line width of the word line, the mask alignment margin for the control gates 30 and floating gates 28 at the time of formation of the through holes 33 and 37 is made sufficiently large and no problem will occur even if the SiN film 36 is not formed.

Next, after metal such as aluminum is deposited on the inter-level insulating film 31, the anisotropic etching process is effected by use of resist patterns formed in a narrow stripe-form in the column direction of the memory cell array with the same width and the same interval from the left end to the right end to form bit lines 32 and metal wirings 38. Thus, contacts between the bit lines 32 and the drain regions 26 are made and contacts between the metal wirings 38 and the source lines 34 are made to complete the memory cell array as shown in FIGS. 2A to 2C.

According to the above manufacturing method, since the etching process is effected by use of the narrow stripe-form patterns with the same width and the same interval as a mask in all of the steps of forming the STI structure, slits and word lines, the etching process can be uniformly effected to attain patterns with the same width and the same interval.

In the above embodiment, in all of the etching steps of forming the STI structure, slits and word lines, they can be formed with the same width and the same interval, but a regular-interval pattern may be used such that the space between the word lines can be set to a first space in an area above all of the drain regions and to a second space different from the first space in an area above all of the source regions. Further, since the effect can be attained in each of the etching steps of forming the STI structure, slits and word lines, this embodiment can be applied to part of the steps as required.

As described above, according to this invention, it is possible to provide a nonvolatile semiconductor memory device and a method for manufacturing the same in which occurrence of a variation in the etching process due to the disturbance of the regular-interval arrangement of the patterns of the memory cell array can be prevented and various electrical characteristics for each memory cell can be made uniform.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device having a memory cell array in which nonvolatile memory cells are arranged in a matrix on a semiconductor substrate and which has element regions isolated by element isolation regions of STI (Shallow Trench Isolation) structure, the element isolation regions comprising:
a plurality of trenches regularly arranged with substantially a same width and at a same interval along a first direction in an area from one end to an opposite end of the memory cell array; and
insulating films filled in said trenches, and the memory cell array comprising:
source lines formed on source regions of the memory cells, said source lines being arranged with a same width and at a same interval in a second direction which intersects the first direction in an area from one end to an opposite end of the memory cell array; and
a common source line arranged in the first direction in an area from one end to the opposite end of the memory cell array, said common source line being connected to each of said source lines in source contact portions.

2. A nonvolatile semiconductor memory device having a memory cell array in which nonvolatile memory cells are arranged in a matrix on a semiconductor substrate, each of the memory cells comprising:
  a tunnel insulating film formed on the semiconductor substrate between source and drain regions;
  a floating gate formed on said tunnel insulating film, each of floating gates of the memory cells in the memory cell array arranged with substantially a same width and at a same interval along a first direction in an area from one end to an opposite end of the memory cell array;
  an insulating film formed on said floating gate; and
  a control gate formed on said insulating film, and
the memory cell array comprising:
  source lines formed on source regions of the memory cells, said source lines being arranged with a same width and at a same interval in a second direction which intersects the first direction in an area from one end to an opposite end of the memory cell array; and
  a common source line arranged in the first direction in an area from one end to the opposite end of the memory cell array, said common source line being connected to each of said source lines in source contact portions.

3. A nonvolatile semiconductor memory device having a memory cell array in which nonvolatile memory cells are arranged in a matrix on a semiconductor substrate, comprising:
  a plurality of word lines regularly arranged with substantially a same width and at a same interval along a first direction in an area from one end to an opposite end of the memory cell array, and
  the memory cell array comprising:
    source lines formed on source regions of the memory cells, said source lines being arranged with a same width of the word lines and at a same interval in the first direction in an area from one end to the opposite end of the memory cell array; and
    a common source line arranged in a second direction in an area from one end to an opposite end of the memory cell array, said common source line being connected to each of said source lines in source contact portions.

4. A nonvolatile semiconductor memory device having a memory cell array in which nonvolatile memory cells are arranged in a matrix on a semiconductor substrate and which has element regions isolated by element Isolation regions of STI (Shallow Trench Isolation) structure,
  the element isolation regions comprising:
    a plurality of trenches regularly arranged with substantially a same width and at a same interval along a first direction from one end to an opposite end of the memory cell array; and
    insulating films filled in said trenches; and
  each of the memory cells comprising;
    a tunnel insulating film formed on the semiconductor substrate between source and drain regions;
    a floating gate formed on said tunnel insulating film, each of floating gates of the memory cells in the memory cell array arranged with substantially a same width and at a same interval along the first direction from one end to an opposite end of the memory cell array,
    an insulating film formed on said floating gate; and
    a control gate formed on said insulating film, and
  the memory cell array comprising:
    source lines formed on source regions of the memory cells, said source lines being arranged with a same width and at a same interval in a second direction which intersects the first direction in an area from one end to an opposite end of the memory cell array; and
    a common source line arranged in the first direction in an area from one end to the opposite end of the memory cell array, said common source line being connected to each of said source lines in source contact portions.

5. A nonvolatile semiconductor memory device having a memory cell array in which nonvolatile memory cells are arranged in a matrix on a semiconductor substrate and which has element regions isolated by element isolation regions of STI (Shallow Trench Isolation) structure,
  the element isolation regions comprising:
    a plurality of trenches regularly arranged with substantially a same width and at a same interval along a first direction from one end to an opposite end of the memory cell array; and
    insulating films filled in said trenches, and
  each of the memory cells comprising;
    a tunnel insulating film formed on the semiconductor substrate between source and drain regions;
    a floating gate formed on said tunnel insulating film;
    an insulating film formed on said floating gate; and
    a control gate formed on said insulating film;
    wherein said control gates form a plurality of word lines regularly arranged with substantially a same width and at a same interval along a second direction from one end to an opposite end of the memory cell array; and,
  the memory cell array comprising:
    source lines formed on source regions of the memory cells, said source lines being arranged with a same width and at a same interval in the second direction which intersects the first direction in an area from one end to an opposite end of the memory cell array; and
    a common source line arranged in the first direction in an area from one end to the opposite end of the memory cell array, said common source line being connected to each of said source lines in source contact portions.

6. A nonvolatile semiconductor memory device having a memory cell array in which nonvolatile memory cells are arranged in a matrix on a semiconductor substrate,
  each of the memory cells comprising:
    a tunnel insulating film formed on the semiconductor substrate between source and drain regions;
    a floating gate formed on said tunnel insulating film, each of floating gates of the memory cells in the memory cell array arranged with substantially a same width and at a same interval along a first direction from one end to an opposite end of the memory cell array;
    an insulating film formed on said floating gate; and
    a control gate formed on said insulating film;
    wherein said control gates constitute a plurality of word lines regularly arranged with substantially a same width and at a same interval in a second direction from one end to the opposite end of the memory cell array; and,
  the memory cell array comprising:
    source lines formed on source regions of the memory cell, said source lines being arranged with a same width and at a same interval in the second direction which intersects the first direction in an area from one end to an opposite end of the memory cell array; and a common source line arranged in the first direction in an area from one end to the opposite end of the memory cell array, said common source line being connected to each of said source lines in source contact portions.

7. A nonvolatile semiconductor memory device having a memory cell array in which nonvolatile memory cells are arranged in a matrix on a semiconductor substrate and which has element regions isolated by element isolation regions of STI (Shallow Trench Isolation) structure, the element isolation regions comprising:
a plurality of trenches regularly arranged with substantially a same width and at a same interval in a first direction from one end to an opposite end of the memory cell array; and
insulating films filled in said trenches, each of the memory cells comprising:
a tunnel insulating film formed on the semiconductor substrate between source and drain regions;
a floating gate formed on said tunnel insulating film with substantially a same width and at a same interval along the first direction from one end to the opposite end of the memory cell array;
an insulating film formed on said floating gate; and
a control gate formed on said insulating film,
wherein said control gates constitute a plurality of word lines regularly arranged with substantially a same width and at a same interval in a second direction which intersects a first direction from one end to an opposite end of the memory cell array; and, the memory cell array comprising:
source lines formed on source regions of the memory cells, said source lines being arranged with a same width and at a same interval in a second direction which intersects the first direction in an area from one end to an opposite end of the memory cell array; and
a common source line arranged in the first direction in an area from one end to the opposite end of the memory cell array, said common source line being connected to each of said source lines in source contact portions.

* * * * *